(12) United States Patent
Huang

(10) Patent No.: US 7,583,549 B2
(45) Date of Patent: Sep. 1, 2009

(54) MEMORY OUTPUT CIRCUIT AND METHOD THEREOF

(75) Inventor: Chao-Sheng Huang, Taipei (TW)

(73) Assignee: Via Technologies, Inc., Taipei (TW)

( * ) Notice: Subject to any disclaimer, the term of this patent is extended or adjusted under 35 U.S.C. 154(b) by 46 days.

(21) Appl. No.: 11/968,319

(22) Filed: Jan. 2, 2008

(65) Prior Publication Data

US 2008/0101132 A1    May 1, 2008

Related U.S. Application Data

(62) Division of application No. 11/563,244, filed on Nov. 27, 2006, now Pat. No. 7,525,854.

(30) Foreign Application Priority Data

Dec. 1, 2005  (TW) ............................... 94142342 A

(51) Int. Cl.
*G11C 7/02* (2006.01)
(52) U.S. Cl. .................. 365/207; 365/189.05; 365/154; 365/230.06; 365/189.07; 365/189.11; 365/189.15
(58) Field of Classification Search ................. 365/207, 365/189.05, 154, 230.06, 189.07, 189.11
See application file for complete search history.

(56) References Cited

U.S. PATENT DOCUMENTS

| | | | | |
|---|---|---|---|---|
| 6,717,877 B2 * | 4/2004 | Suzuki et al. | .......... | 365/210.12 |
| 2002/0097623 A1 | 7/2002 | Suzuki et al. | | |
| 2004/0257896 A1 * | 12/2004 | Jeung | .......................... | 365/203 |
| 2006/0056229 A1 * | 3/2006 | Maeda et al. | ................ | 365/154 |
| 2007/0047281 A1 * | 3/2007 | Ramaraju et al. | ............. | 365/49 |

OTHER PUBLICATIONS

OA from parent U.S. Appl. No. 11/563,244 mailed Mar. 12, 2008.

* cited by examiner

*Primary Examiner*—Huan Hoang
*Assistant Examiner*—Fernando N Hidalgo
(74) *Attorney, Agent, or Firm*—Thomas, Kayden, Horstemeyer & Risley

(57) ABSTRACT

An output circuit of a memory is provided. The output circuit includes a first pre-charge circuit, a multiplexer, and a sense amplifier. The first pre-charge circuit pre-charges the voltage of a target readout bit line to the logic high level according to a pre-charge signal. The multiplexer selects the target readout bit line from multiple readout bit lines according to a selecting signal. The sense amplifier detects the voltage of the target readout bit line after the target memory cell is selected to be readout.

12 Claims, 4 Drawing Sheets

MEMORY OUTPUT CIRCUIT AND METHOD THEREOF

CROSS REFERENCE TO RELATED APPLICATIONS

This application is a divisional application of pending U.S. patent application Ser. No. 11/563,244, filed on Nov. 27, 2006 and entitled "MEMORY OUTPUT CIRCUIT AND METHOD THEREOF".

BACKGROUND OF THE INVENTION

1. Field of the Invention

The invention relates to an output circuit of a memory and a method thereof; and more particularly, to an output circuit and method thereof for a static random access memory (SRAM).

2. Description of the Related Art

Most memory data is in the form of binary bits and each bit is stored in a memory cell as 0 or 1. The memory cells are arranged in a rectangular matrix and form the principle part of the memory. Before writing data to a specific memory cell, the memory cell is selected by an address latch circuit, and the bit is then written into the memory cell. Before data is read from a specific memory cell, the memory cell is selected by the address latch circuit, and the bit stored in the memory cell is then output in the form of current or voltage through the output circuit. Because the current or voltage output from the memory cell is very weak, it is amplified by a current or voltage amplifier to the level of standard digital signal strength.

Static random access memory (SRAM) remains data therein as long as power is supplied, unlike dynamic random access memory (DRAM), which requires periodic refreshing, with access time of a SRAM less than that of a DRAM. Thus, SRAM is often used as cache memory, or as part of the random access memory of a digital to analog converter in a graphics card.

The performance a SRAM is determined by the access time for determining the operating speed of the memory and a controller or a central processing unit as a whole. Because there are thousands of SRAM cells connected to a single output circuit, a great number of parasitic capacitors are generated. Since the driving ability of a SRAM cell is weak, the latency caused by the parasitic capacitors is a factor affecting the access time of a SRAM. Thus, an output circuit capable of reducing the SRAM access time to increase the performance of the SRAM is desirable.

BRIEF SUMMARY OF THE INVENTION

The invention provides an output circuit of a memory. The output circuit is biased between a voltage source of a logic high level and a ground, the output circuit is connected between a plurality of readout bit lines and an output terminal, and each of the readout bit lines is connected to at least one memory cell, the output circuit includes: at least one first pre-charge circuit, connected to a target readout bit lines of a target memory cell, pre-charging the voltage of target the readout bit line to logic high level according to a pre-charge signal before reading data from the target memory cell. A multiplexer, connected to the first pre-charge circuit; and a sense amplifier, connected to the multiplexer, detecting the voltage of the target readout bit line while the target memory cell is selected, and comparing the voltage of the target readout bit line with the logic high level to generate an output signal to a first output node and an inverse output signal to a second output node. Wherein the multiplexer selects the target readout bit line according to a selecting signal and the target readout bit line is connected to the sense amplifier; wherein the target readout bit line is one of the plurality of the readout bit lines.

A method for outputting a data of a target memory cell from a memory, wherein the target memory cell corresponds to a target readout bit line and the target readout bit line is one of a plurality of the readout bit lines The method includes: pre-charging of the voltages of the readout bit lines to logic high level; selecting the target memory cell and outputting the voltage of the target memory cell to the target readout bit line; detecting the voltage of the target readout bit line; and comparing the voltage of the target readout bit line and a source voltage of logic high level to generate a output signal and an inverse output signal on a first output node and a second output node, wherein the inverse output signal is inverted to the output signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
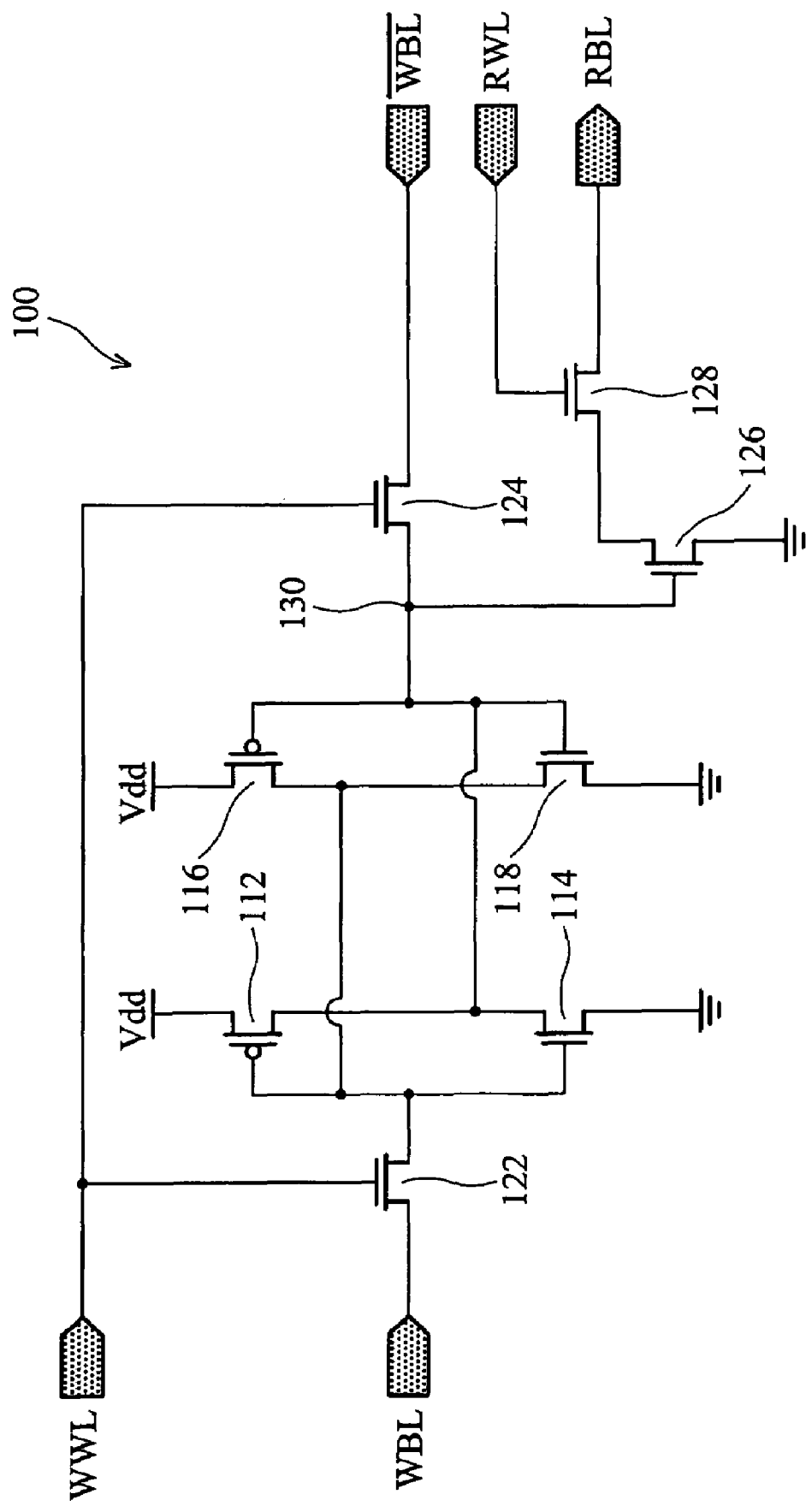
FIG. 1 is a circuit diagram of a SRAM cell.

FIG. 1 is a memory cell 100 which is a dual port memory with eight transistors (8T) and a single output terminal. A memory circuit includes a plurality of memory cells arranged in a matrix. The transistors include pull-up transistors 112 and 116, pull-down transistors 114 and 118, pass gate transistors 122 and 124, and readout port transistors 126 and 128. The pull-up transistors 112 and 116 are PMOS transistors, the pull-down transistors 114 and 118, the pass gate transistors 122 and 124, and the readout port transistors 126 and 128 are all NMOS transistors. In the present invention, the memory cell is a SRAM cell.

Sources of the pull-up transistors 112 and 116 are respectively connected to a voltage source Vdd. Drain of the pull-up transistor 112 is connected to the source of the pass gate transistor 124, the drain of the pull-down transistor 114, and the gate of the pull-up transistor 116. Similarly, the drain of the pull-up transistor 116 is connected to the source of the pass gate transistor 122, the drain of the pull-down transistor 118, and the gate of the pull-up transistor 112. The gate of the pull-up transistor 112 is connected to the gate of the pull-down transistor 114; and the gate of the pull-up transistor 116 is connected to the gate of the pull-down transistor 118 and the gate of the readout port transistor 126. The sources of the pull-down transistors 114 and 118 are grounded, the source of the readout port transistor 126 is also grounded.

The drains of the pass gate transistors 122 and 124 are respectively connected to the write bit line WBL and the complementary write bit line $\overline{WBL}$. The gates of the pass gate transistors 122 and 124 are respectively connected to the write word line WWL. The readout port transistors 126 and 128 are series connected between the ground and the readout bit line RBL; and the gate of the readout port transistors 128 is connected to the readout word line RWL. The write bit line WBL, the complementary write bit line $\overline{WBL}$, the write word line WWL, the readout bit line RBL, and the readout word line RWL may be extended to other memory cells or other devices such as a row and column latch, a decoder, a select driver, a control logic circuit, a sense amplifier, a multiplexer, or a buffer.

The output circuit of a memory circuit includes a multiplexer which decodes the address of a target memory cell to generate a selecting signal for selecting the corresponding output of the target memory cell. The output circuit also includes a sense amplifier, the multiplexer is coupled to the output terminal of the sense amplifier for selecting a corresponding output to the target memory cell.

Figure 2:
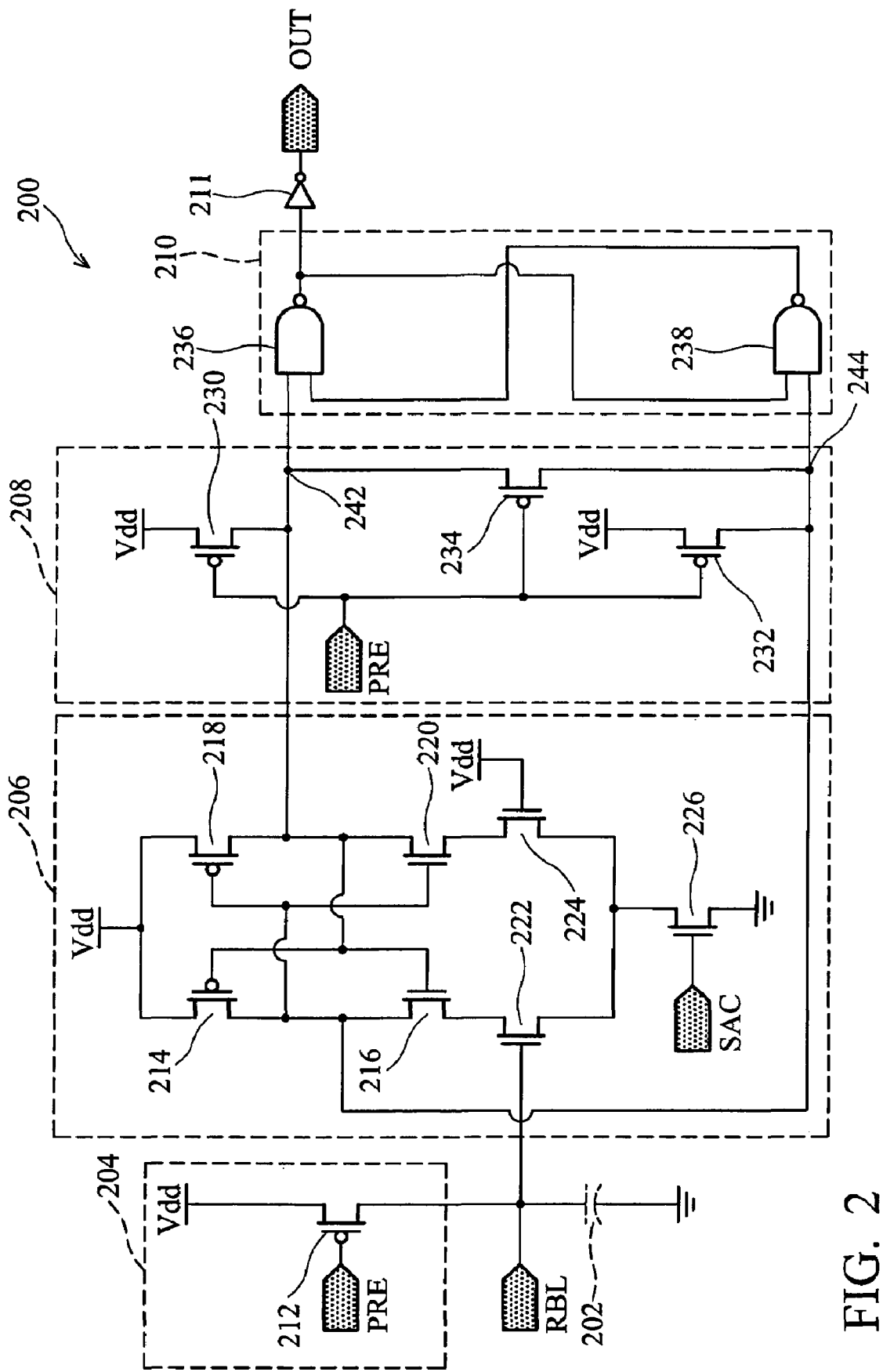
FIG. 2 is a circuit diagram of an output circuit of a SRAM.

FIG. 2 is an output circuit 200 of a memory circuit according to the present invention. The output circuit 200 includes a first pre-charge circuit 204, a second pre-charge circuit 208, a sense amplifier 206, a latch circuit 210, and an inverter 211. The transistors 212, 214, 218, 230, 232 and 234 are PMOS transistors, and the transistors 216, 220, 222, 224 and 226 are NMOS transistors. The input terminal of the output circuit 200 is the readout bit line RBL connected to the output terminals of a plurality of SRAM circuits. Due to the large number of memory cells connected to the readout bit line RBL, a large parasitic capacitor which can be represented with a parasitic capacitor 202 coupled between the readout bit line RBL and the ground as shown in FIG. 2.

Data stored in the memory cell 100 of FIG. 1 may be 0 or 1, and the voltage at the node 130 in FIG. 1 may be logic high level or logic low level depending on data stored in the memory cell 100. If the voltage of node 130 is at logic high level, the readout port transistor 126 is turned on; otherwise the readout port transistor 126 is turned off. If a SRAM circuit 100 is ready to be read, the readout bit line RBL is charged to logic high level (ex. Vdd) through the first pre-charge circuit 204 before reading data. During charging the readout bit line RBL, a pre-charge signal PRE is pulled down to logic low level (ex. ground) to turn on the PMOS transistor 312, and the readout bit line RBL is then charged to logic high level (ex. Vdd). At the same time, the pre-charge signal PRE in the second pre-charge circuit 208 is also pulled down to logic low level (ex. ground) to turn on the PMOS transistors 230, 232 and 234. The voltages of nodes 242 and 244 are then pulled up to logic high level (ex. Vdd). The two inverse output terminals of the sense amplifier 206 and the two inverse input terminals of the latch circuit 210 are respectively connected via the nodes 242 and 234. After completely charge the readout bit line RBL, the pre-charge signal PRE connected to the gate of the PMOS transistor 212 is pulled up to logic high level to turn off the PMOS transistor 212. The PMOS transistors 230, 232 and 234 are then turned off since the pre-charge signal PRE has been pulled up to logic high level, resulting in disconnection of the nodes 242 and 244. The voltage of the readout word line RWL of the selected SRAM circuit 100 is then pulled up to logic high level to turn on the readout port transistor 128.

If the voltage at the node 130 is at logic high level, the readout port transistors 126 and 128 are turned on. Because the source of the transistor 126 is grounded, the voltage of the readout bit line RBL is pulled down to the ground voltage. However, due to the presence of the parasitic capacitor 202, voltage drop of the readout bit line RBL is delayed. The sense amplifier 206 compares the voltages at the gates of the two differential input transistors 222 and 224 to output two inverse voltages at the nodes 242 and 244. Because the voltage of the readout bit line RBL drops slowly, the sense amplifier 206 should be properly activated when the gate voltage of the NMOS transistor 222 is dropped enough for the sense amplifier 206 to correctly detect without delaying the access time too much. The sense amplifier 206 could be activated by pulling up the voltage of the sense amplifier activation signal SAC to logic high level to turn on the NMOS transistor 226. If the sense amplifier activation signal SAC is pulled up to the logic high level at an appropriate time, the sense amplifier 206 outputs the low voltage at the node 242 and the high voltage at the node 244.

The latch circuit 210 includes the NAND gates 236 and 238. The latch circuit 210 detects the output voltages of the sense amplifier 206 at nodes 242 and 244. The latch circuit 210 also latches and outputs the high voltage, inversed to the voltage at the node 242. The inverter 211 then inverts the output of the latch circuit 210 and outputs the low voltage at the output terminal OUT.

If the voltage at the node 130 is at logic low level, the readout port transistor 126 is turned off. Thus, the voltage of the readout bit line RBL couldn't be pulled down through the readout port transistors 126, and is still maintained at the logic high level after the readout bit line RBL is pre-charged. Because the gate voltages of the differential input transistors 222 and 224 are both at the logic high level, the sense amplifier 206 couldn't produce a correct output. To solve this problem, the gate width of the differential input transistor 222 is extended. For example, the gate width of the input transistor 222 might be 1.5 times as long as that of the input transistor 224. Thus, when the gates of the differential input transistors 222 and 224 are both connected to the same high voltage (ex. Vdd), due to the input transistor 222 has lower gate resistance, the drain of the input transistor 222 has more capability to pull down the voltage than the input transistor 224. Therefore, drain voltage of the transistor 216 is low, and drain voltage of the transistor 220 is high. When the sense amplifier 206 detects the logic high level at the readout bit line RBL, a low voltage at the node 244 is output. The latch circuit 210 then detects the output voltages of the sense amplifier 206 at nodes 242 and 244, and then latches and outputs the low voltage, inversed to the voltage at the node 242. Finally, the inverter 211 inverts the output of the latch circuit 210, and outputs the high voltage at the output terminal OUT.

Figure 3:
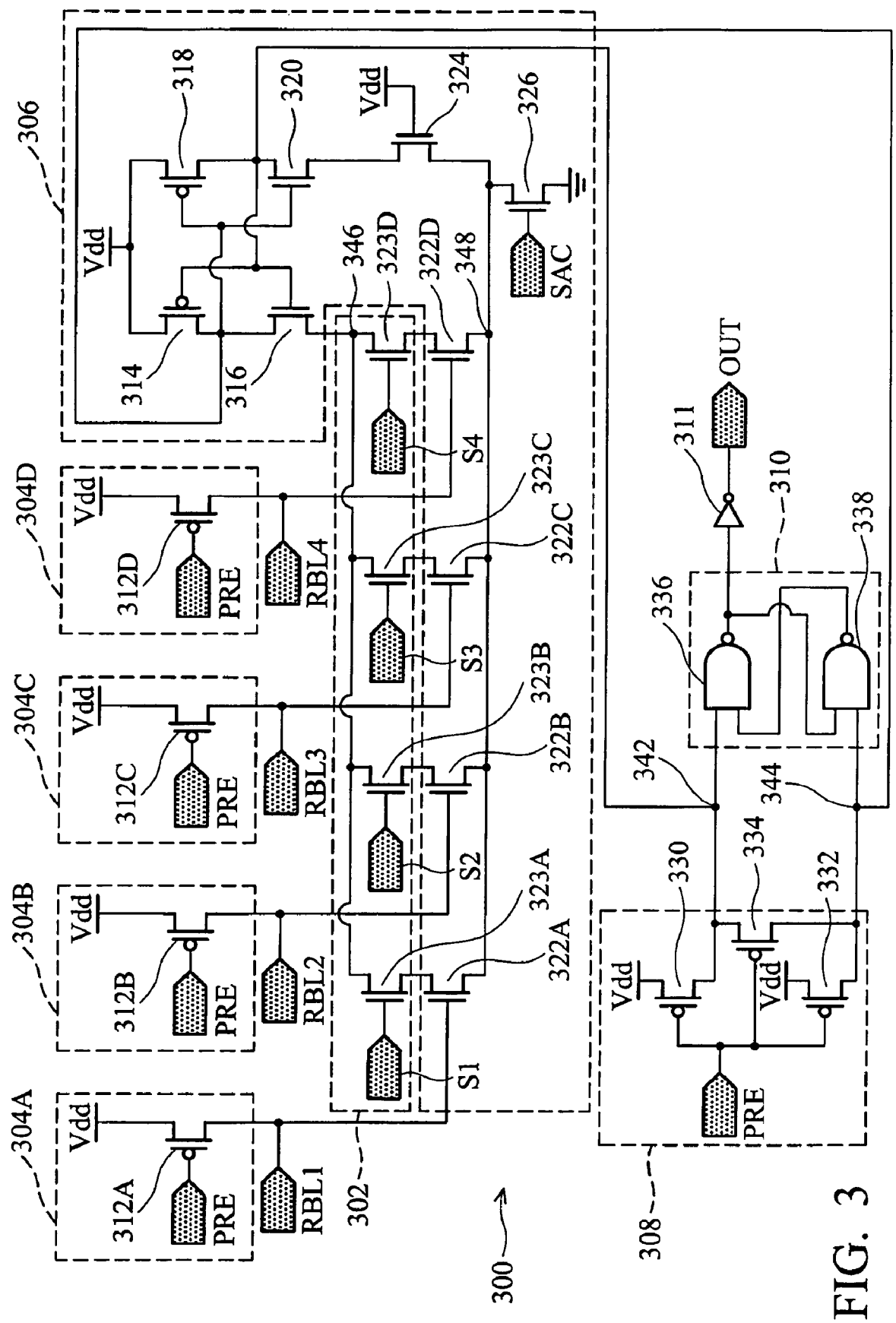
FIG. 3 is a circuit diagram of an output circuit of a SRAM according to the invention.

FIG. 3 shows an output circuit 300 of a memory circuit according to the present invention. The output circuit 300 is coupled to a plurality of read bit lines RBLs, and the number of the read bit lines is depended on the number of column of the connected memory cell which addresses is decoded by the multiplexer. The output circuit 300 includes a plurality of first pre-charge circuit 304, a second pre-charge circuit 308, a multiplexer 302, a sense amplifier 306, a latch circuit 310, and an inverter 311. The number of the first pre-charge circuits is depended on the number of the readout bit lines RBLs; and the number of the connected readout bit lines RBLs is substantially equal to the number of the column of the connected memory cells. Due to a large number of memory cells are connected, a parasitic capacitance delaying the voltage changing speed of the read bit lines is generated. In the embodiment, assume that there are four columns of the connected memory cells; therefore the number of readout bit lines RBLs is also four.

An input terminal of the output circuit 300 is connected to a plurality of readout bit lines RBLs; and each readout bit line RBL is connected to at least one memory cells. When a target memory cell of the memory circuit is needed to be read, the read bit line corresponding to the target memory cell is selected according to a selecting signal obtained by decoding the column address of the target memory cell. In the present invention, four readout bit lines RBL1, RBL2, RBL3, and RBL4 are connected to the input terminals of the output circuit 300, as shown in FIG. 3.

The invention provides four first pre-charge circuits 304A, 304B, 304C, and 304D, respectively connected to the readout bit lines RBL1, RBL2, RBL3, and RBL4. Each first pre-charge circuit includes a PMOS transistor coupled between a voltage source Vdd and the corresponding readout bit line, such as the PMOS transistors 312A, 312B, 312C, and 312D. According to the pre-charge signal PRE received by the gates, the PMOS transistors 312A, 312B, 312C, and 312D are respectively turned on to conduct the voltage source Vdd to the readout bit lines RBL1, RBL2, RBL3, and RBL4.

The multiplexer 302 includes the input selection transistors 323A~323D for selecting one of the read bit lines RBL1~RBL4 to connected to the sense amplifier 306. The input selection transistors 323A~323D are NMOS transistors connected between the input node 346 and the differential input transistors 322A~322D. The gates of the input selection transistors 323A~323D are respectively connected to one of the selecting signals S1~S4, obtained by decoding the column address of the target memory cell and identifies one of the readout bit lines as the input of the sense amplifier 306.

The sense amplifier 306 includes the NMOS transistors 316, 320, 322A~322D, 324, and 326, and the PMOS transistors 314 and 318. The transistor 326 is connected between an input node 348 and the ground; and the gate is connected to a sense amplifier activation signal SAC, which can enable or disable the sense amplifier 306. Each of the differential input transistors 322A~322D is connected between the source of one of the input selection transistors 323A~323D and an input node 348; and the gates are connected to one of the readout bit lines RBL1~RBL4. The differential input transistor 324 is connected between the source of the NMOS transistor 320 and the input node 348; and the gate is connected to the voltage source Vdd. Both of the gates of the PMOS transistor 314 and the NMOS transistor 316 are connected to the output node 342. In addition, the drains of the PMOS transistor 318 and the NMOS transistor 320 are also connected to the output node 342. Both of the gates of the PMOS transistor 318 and the NMOS transistor 320 are connected to the output node 344. In addition, the drains of the PMOS transistor 314 and the NMOS transistor 316 are also connected to the output node 344. The output nodes 342 and 344 are two inverse outputs of the sense amplifier 306. The sources of the PMOS transistors 314 and 318 are connected to the voltage source Vdd, and the source of the NMOS transistor 316 is connected to the output node 346.

The second pre-charge circuit 308 includes the PMOS transistors 330, 332, and 334. The PMOS transistor 330 is connected between the voltage source Vdd and the output node 342. The PMOS transistor 332 is connected between the voltage source Vdd and the output node 344. The PMOS transistor 334 is connected between the output nodes 342 and 344. Gates of the PMOS transistors 330, 332, and 334 are connected to a pre-charge signal PRE, which pulls up the voltages of the output nodes 342 and 344 to the voltage source Vdd. The latch circuit 310 includes the NAND gates 336 and 338. The latch circuit 310 detects and latches the output voltages of the sense amplifier 306 at the output nodes 342 and 344. The two input terminals of the NAND gate 336 are respectively connected to the output node 342 and the output terminal of the NAND gate 338, and the two input terminals of the NAND gate 338 are respectively connected to the output node 344 and the output terminal of the NAND gate 336. The inverter 311 is connected to the output terminal of the NAND gate 336.

Data stored in the memory cell 100 of FIG. 1 may be 0 or 1, and the voltage at the node 130 in FIG. 1 may be logic high level or logic low level depending on data stored in the memory cell 100. If the voltage of node 130 is at logic high level, the readout port transistor 126 is turned on; otherwise the readout port transistor 126 is turned off.

Figure 4:
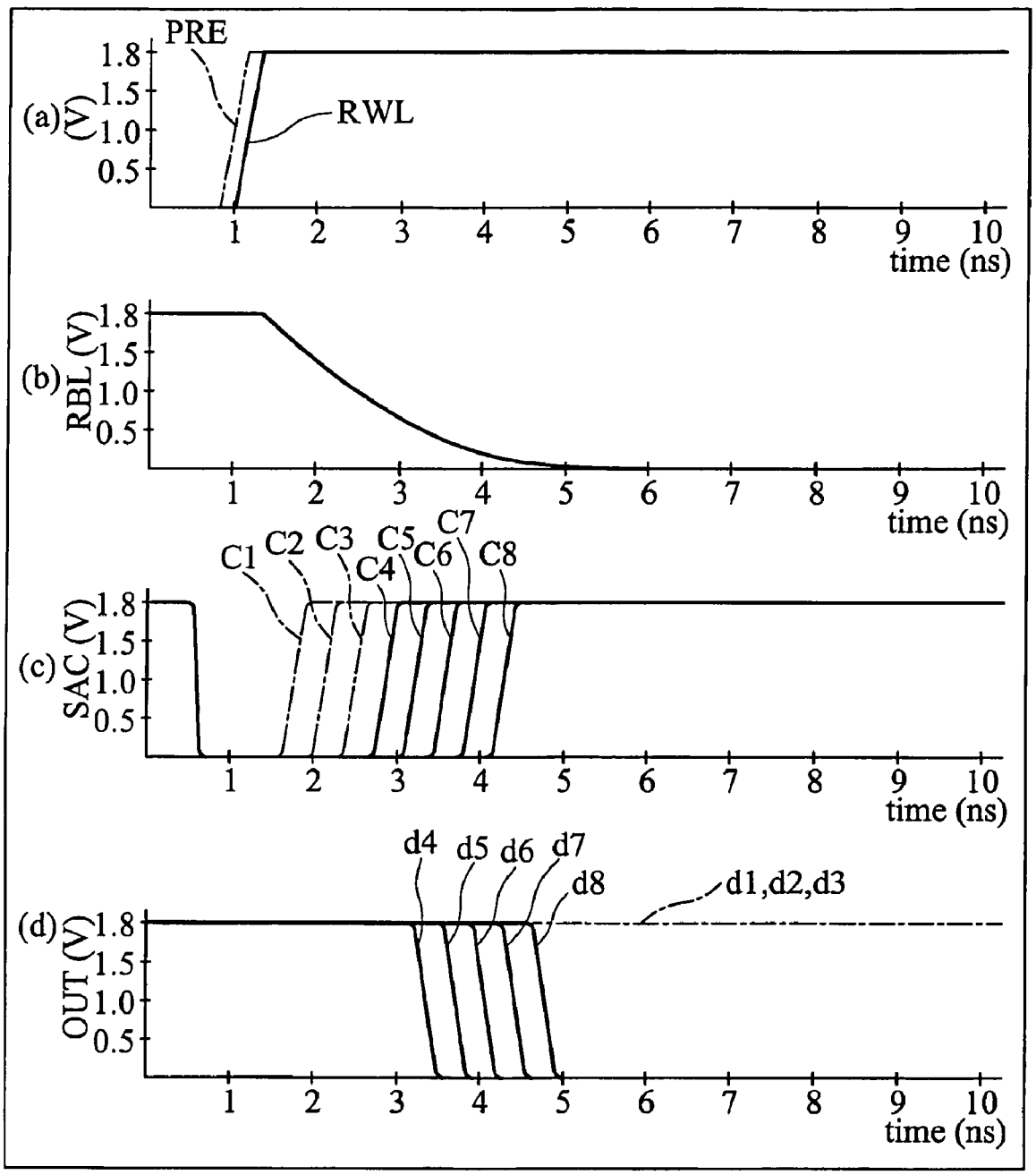
FIG. 4(a) shows the timing sequence of a pre-charge signal PRE in FIG. 3 and the voltage of a read word line.
FIG. 4(b) shows the timing sequence of the voltage of a read bit line in FIG. 3.
FIG. 4(c) shows the timing sequence of a sense amplifier activation signal SAC in FIG. 3.
FIG. 4(d) shows the timing sequence of an output signal of the output circuit in FIG. 3.

Assume the memory cell 100 is read, and the readout port transistor 128 of the memory cell 100 is assumed to be connected to the readout bit line RBL4. Before the data of the memory cell 100 is read, the readout bit line RBL4 is charged to logic high level (ex. voltage source Vdd) through the first pre-charge circuit 304D. During charging the read bit line RBL4, the pre-charge signal PRE is pulled down to logic low level (ex. ground) to turn on the PMOS transistor 312D, and the readout bit line RBL4 is then charged to logic high level. At the same time, the pre-charge signal PRE in the second pre-charge circuit 308 is also pulled down to logic low level (ex. ground) to turn on the PMOS transistors 330, 332 and 334, and the voltages of nodes 342 and 344 are then pulled up to the logic high level. The two inverse output terminals of the sense amplifier 306 and the two inverse input terminals of the latch circuit 310 are respectively connected via the output nodes 342 and 334. After the readout bit line RBL4 is charged completely, the pre-charge signal PRE applied to the gate of the PMOS transistor 312D is pulled up to logic high level to turn off the PMOS transistor 312D. The PMOS transistors 330, 332 and 334 are also turned off due to the pre-charge signal PRE being pulled up to logic high level, resulting in disconnection of the nodes 342 and 344. The voltage of the readout word line RWL of the target memory cell 100 is then pulled up to logic high level to turn on the readout port transistor 128. Referring to FIG. 4(a), the pre-charge signal PRE is first pulled up to logic high level, and the voltage on the readout word line RWL is then pulled up to logic high level.

Because four input selection transistors 323A~323D of the multiplexer 302 are connected between the input nodes 346 and 348 of the sense amplifier 306, a selecting signal S4 is generated to turn on the transistor 323D, and the sense amplifier 306 is then connected to the readout bit line RBL4 containing the read-out bit of the target memory cell 100. The selecting signals S1, S2, S3, and S4, decoded according to the column address of target memory cell 100 are assumed to be 0, 0, 0, and 1. Thus, the input selection transistors 323A, 323B, and 323C are turned off, and the readout bit lines RBL1~RBL3 are separated from the sense amplifier 306.

If the voltage at the node 130 is high, the readout port transistors 126 and 128 are turned on. Because the source of the transistor 126 is grounded, the voltage of the readout bit line RBL4 is gradually pulled down to the ground voltage. Due to the presence of parasitic capacitor 302, voltage drop of the readout bit line RBL4 is delayed as shown in FIG. 4(b). The sense amplifier 306 compares the voltages at the gates of the two differential input transistors 322D and 324 to generate two inverse voltages at the nodes 342 and 344. Because the voltage of the readout bit line RBL4 drops slowly, the sense amplifier 306 should be activated when the gate voltage of the NMOS transistor 322D drops enough for the sense amplifier 306 to correctly detect without delaying the access time too much. The sense amplifier 306 could be activated by pulling up the voltage of the sense amplifier activation signal SAC to logic high level to turn on the NMOS transistor 326. Referring to FIG. 4(c), if the sense amplifier activation signal SAC is pulled up too early as shown with the dotted lines C1 to C3, the sense amplifier 306 outputs an erroneous logic high level as shown with the dotted lines d1 to d3 in FIG. 4(d). Otherwise, if the sense amplifier activation signal SAC is properly pulled up as shown with the solid lines C4 to C8, the sense amplifier 306 outputs a correct logic low level voltage at the node 342 as shown with the solid lines d4 to d8 in FIG. 4(d), and also outputs a voltage of logic high level at the node 344.

The latch circuit 310 includes the NAND gates 336 and 338 for detecting the output voltages of the sense amplifier 306 at nodes 342 and 344. The latch circuit 310 also latches and outputs the high voltage, inversed to the voltage at the node 342. The inverter 311 then inverts the output of the latch circuit 310, and outputs the low voltage on the output terminal OUT.

If the voltage at the node 130 is at logic low level, the readout port transistor 126 is turned off. Thus, the voltage on the readout bit line RBL couldn't be pulled down through the readout port transistors 126, and is still maintained at logic high level after the readout bit line RBL is pre-charged. Because the gate voltages of the differential input transistors 322D and 324 are both at logic high level, the sense amplifier 306 couldn't produce a correct output. To solve this problem, the gate widths of the differential input transistors 322A~322D and the gate widths of the selection transistors 323A~323D are extended. For example, the gate widths of the differential input transistors 322A~322D and the gate widths of the selection transistors 323A~323D might be 3.5 times of the gate width of the differential input transistor 324 in length. Thus, when the gates of the differential input transistors 322A~322D and 324 are both connected to the same voltage of logic high level (ex. Vdd), due to the cascade equivalent resistance of the input selection transistors 322A~322D and the differential input transistors 322~322D is lower than the gate resistance of the differential input transistor 324, the drains of the differential input transistors 322A~322D have more ability to pull down voltage than the differential input transistor 324. Therefore, the drain voltage of the transistor 316 is low, and the drain voltage of the transistor 320 is high. When the sense amplifier 306 detects the logic high level on the readout bit line RBL4, the high voltage at the node 342 is output, and the low voltage at the node 344 is also output. The latch circuit 310 then detects the output voltages of the sense amplifier 306 at nodes 342 and 344; then latches and outputs the low voltage, inversed to the voltage at the node 342. Finally, the inverter 311 inverts the output of the latch circuit 310, and outputs the high voltage on the output terminal OUT.

The invention uses a sense amplifier in the output circuit of a SRAM to amplify low-level differential signals and reduce access time to the SRAM. The two input terminals of the sense amplifier are respectively connected to a voltage source Vdd and a readout bit line. The gate width of the transistor, connected to the readout bit line, is increased to reduce the gate resistance of the transistor. Because the input characteristics of the sense amplifier are asymmetrical, a multiplexer is coupled between one input terminal of the sense amplifier and the readout bit line to select one of the readout bit lines as the input of the sense amplifier. Thus, the output circuit of SRAM can serve multiple readout bit lines, reducing the number of the sense amplifiers, simplifying the complexity of output circuit design. Thus, the chip area occupied by the output circuit is reduced, more chips can be produced with a single wafer, and manufacture costs are reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for outputting a data of a target memory cell from a memory, wherein the target memory cell corresponds to a target readout bit line and the target readout bit line is one of a plurality of the readout bit lines, comprising:
   pre-charging of the voltages of the readout bit lines to logic high level;
   selecting the target memory cell and outputting the voltage of the target memory cell to the target readout bit line;
   detecting the voltage of the target readout bit line; and
   comparing the voltage of the target readout bit line and a source voltage, which is logic high level, with a sense amplifier to generate a output signal and an inverse output signal on a first output node and a second output node, wherein the inverse output signal is inverted to the output signal;
   wherein the sense amplifier comprises:
   a first differential input transistor, having a gate connected to one of the readout bit lines for receiving the voltage of the target readout bit line, and a source connected to a node electrically conductive selectively coupled to the target readout bit line
   a second differential input transistor, having a gate connected to the source voltage with the logic high level, and a source connected to the node electrically conductive selectively coupled to the target readout bit line.

2. The method as claimed in claim 1, further comprising pulling up the voltage of the first output node and the voltage of the second output node to logic high level before the target memory cell is selected.

3. The method as claimed in claim 1, further comprising inverting and outputting the output signal.

4. The method as claimed in claim 1, wherein if the data is 1, pulling down the voltage of the target readout bit line, then outputting a low voltage at the first output node and a high voltage at the second output node.

5. The method as claimed in claim 1, further comprising properly comparing the voltage of the target readout bit line and the source voltage according to an activation signal.

6. The method as claimed in claim 1, if the data is 0, pulling up the voltage of the target readout bit line, then outputting a high voltage at the first output node and a low voltage at the second output node.

7. The method as claimed in claim 1, wherein an asymmetric sense amplifier is applied to distinguish the voltage difference of the target readout bit line and the source voltage.

8. The method as claimed in claim 1, wherein the memory is a static random access memory (SRAM).

9. The method as claimed in claim 1, wherein the first differential input transistor, the second differential input transistor, and the input selection transistors are NMOS transistors.

10. The method as claimed in claim 1, wherein gate width of the first differential input transistor and the input selection transistors are larger than the gate width of the second differential input transistor.

11. The method as claimed in claim 1, wherein the gate width of the first differential input transistor and the input selection transistors are substantially 3.5 times of the gate width of the second differential input transistor in length.

12. The method as claimed in claim 1, the sense amplifier further comprising:
- a first PMOS transistor, wherein the source is connected to the voltage source, the drain is connected to the second output node, and the gate is connected to the first output node;
- a second PMOS transistor, wherein the source is connected to the voltage source, the drain is connected to the first output node, and the gate is connected to the second output node;
- a first NMOS transistor, wherein the source is dynamically coupled to drain of the at least one first differential input transistor, the drain is connected to the second output node, and the gate is connected to the first output node and the second output node;
- a second NMOS transistor, wherein the source is connected to the drain of the second differential input transistor, the drain is connected to the first output node, and the gate is connected to the second output node; and
- a third NMOS transistor, wherein the drain is connected to the second input node, the source is connected to the ground, and the gate is connected to a sense amplifier activation signal activating the sense amplifier.

* * * * *